United States Patent
Chiu et al.

(10) Patent No.: US 10,074,586 B2
(45) Date of Patent: Sep. 11, 2018

(54) THERMAL DISSIPATION DEVICE AND SEMICONDUCTOR PACKAGE DEVICE INCLUDING THE SAME

(71) Applicant: Advanced Semiconductor Engineering, Inc., Kaohsiung (TW)

(72) Inventors: Pin Hung Chiu, Kaohsiung (TW); Yu Li Chung, Kaohsiung (TW); Shu Ling Su, Kaohsiung (TW); Yi Tzu Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 5 days.

(21) Appl. No.: 15/454,646

(22) Filed: Mar. 9, 2017

(65) Prior Publication Data

US 2018/0138105 A1    May 17, 2018

(30) Foreign Application Priority Data

Nov. 14, 2016    (TW) .............................. 105217315 U

(51) Int. Cl.
| H01L 23/367 | (2006.01) |
| H01L 23/00 | (2006.01) |
| H01L 23/31 | (2006.01) |

(52) U.S. Cl.
CPC ...... *H01L 23/3675* (2013.01); *H01L 23/3121* (2013.01); *H01L 24/49* (2013.01); *H01L 2224/48091* (2013.01)

(58) Field of Classification Search
CPC combination set(s) only.
See application file for complete search history.

(56) References Cited

U.S. PATENT DOCUMENTS

| 6,486,564 | B2 | 11/2002 | Liu et al. | |
| 2003/0161111 | A1* | 8/2003 | Yoshida | H01L 23/42 |
| | | | | 361/719 |
| 2004/0032021 | A1 | 2/2004 | Shieh et al. | |
| 2007/0200225 | A1 | 8/2007 | Ibrahim et al. | |
| 2010/0230791 | A1* | 9/2010 | Tran | H01L 33/486 |
| | | | | 257/675 |
| 2011/0012252 | A1* | 1/2011 | Gao | H01L 25/071 |
| | | | | 257/698 |
| 2015/0173169 | A1* | 6/2015 | Zhang | H05K 1/0203 |
| | | | | 361/720 |

FOREIGN PATENT DOCUMENTS

JP    2004-079996 A    3/2004

* cited by examiner

*Primary Examiner* — Mamadou Diallo
(74) *Attorney, Agent, or Firm* — Foley & Lardner LLP

(57) ABSTRACT

A thermal dissipation device includes a main body and a support member. The main body has an upper surface, a lower surface opposite to the upper surface, and a lateral surface. The main body defines an injection hole extending through the main body, and includes an inner ring protruding from the upper surface and adjacent to the injection hole and an outer ring protruding from the upper surface and adjacent to the lateral surface. The support member connects to the lateral surface of the main body. An upper surface of the inner ring is higher than an upper surface of the outer ring. A first intersection point between the inner ring and the upper surface of the main body is higher than a second intersection point between the outer ring and the upper surface of the main body.

26 Claims, 14 Drawing Sheets

THERMAL DISSIPATION DEVICE AND SEMICONDUCTOR PACKAGE DEVICE INCLUDING THE SAME

CROSS-REFERENCE TO RELATED APPLICATIONS

This application claims the benefit of and priority to Taiwan Patent Application No. 105217315, filed Nov. 14, 2016, the contents of which are incorporated herein by reference in its entirety.

BACKGROUND

1. Field of the Disclosure

The present disclosure relates to a thermal dissipation device and a semiconductor package device, and more particularly to a thermal dissipation device defining an injection hole on an upper portion thereof and a semiconductor package device including the thermal dissipation device.

2. Description of the Related Art

A method for manufacturing a ball grid array (BGA) semiconductor package device may have some problems. Since a molding compound flows laterally into a cavity through a lateral runner and a mold gate, such lateral flow of the molding compound impacts gold wires which originally stand upright. The gold wires may tilt and contact neighboring gold wires to form a short circuit. Furthermore, the gold wires may even be disengaged from a semiconductor chip or a bonding pad of a substrate, thus forming an open circuit. In a case where a package device includes a plurality of semiconductor chips stacked together, short circuits and open circuits may occur even more easily due to lengthened wires.

In light of the above, it is desirable to provide a thermal dissipation device and semiconductor package device to address the aforementioned problems.

SUMMARY

In some embodiments, a thermal dissipation device includes a main body and a support member. The main body has an upper surface, a lower surface opposite to the upper surface, and a lateral surface. The main body defines an injection hole extending through the main body, and includes an inner ring protruding from the upper surface and adjacent to the injection hole and an outer ring protruding from the upper surface and adjacent to the lateral surface. The support member connects the lateral surface of the main body. An upper surface of the inner ring is higher than an upper surface of the outer ring. A first intersection point between the inner ring and the upper surface of the main body is higher than a second intersection point between the outer ring and the upper surface of the main body.

In some embodiments, a thermal dissipation device includes a main body and a support member. The main body has an upper surface, a lower surface opposite to the upper surface, an inner surface, and a lateral surface. The main body defines an injection hole extending through the main body and adjacent to the inner surface. The support member connects the lateral surface of the main body. The upper surface of the main body includes a first upper surface and a second upper surface, and the injection hole has a lateral surface. The inner surface of the main body extends between the second upper surface and the first upper surface. The lateral surface of the injection hole extends between the first upper surface and the lower surface of the main body.

In some embodiments, a semiconductor package device includes a substrate, an electronic component, a thermal dissipation device and a sealant. The electronic component is disposed on the substrate. The thermal dissipation device is disposed on the substrate and covers the electronic component. The thermal dissipation device includes a main body and a support member. The main body has an upper surface, a lower surface opposite to the upper surface, an inner surface, and a lateral surface. The main body defines an injection hole extending through the main body and adjacent to the inner surface. The support member defines at least one through hole. The support member connects the lateral surface of the main body and is disposed on the substrate. The sealant encapsulates the substrate, the electronic component and the thermal dissipation device. The upper surface includes a first upper surface and a second upper surface. The injection hole has a lateral surface. The inner surface of the main body extends between the second upper surface and the first upper surface. The lateral surface of the injection hole extends between the first upper surface and the lower surface of the main body. The sealant covers a space defined by the first upper surface and the inner surface of the main body.

DETAILED DESCRIPTION

Figure 1:
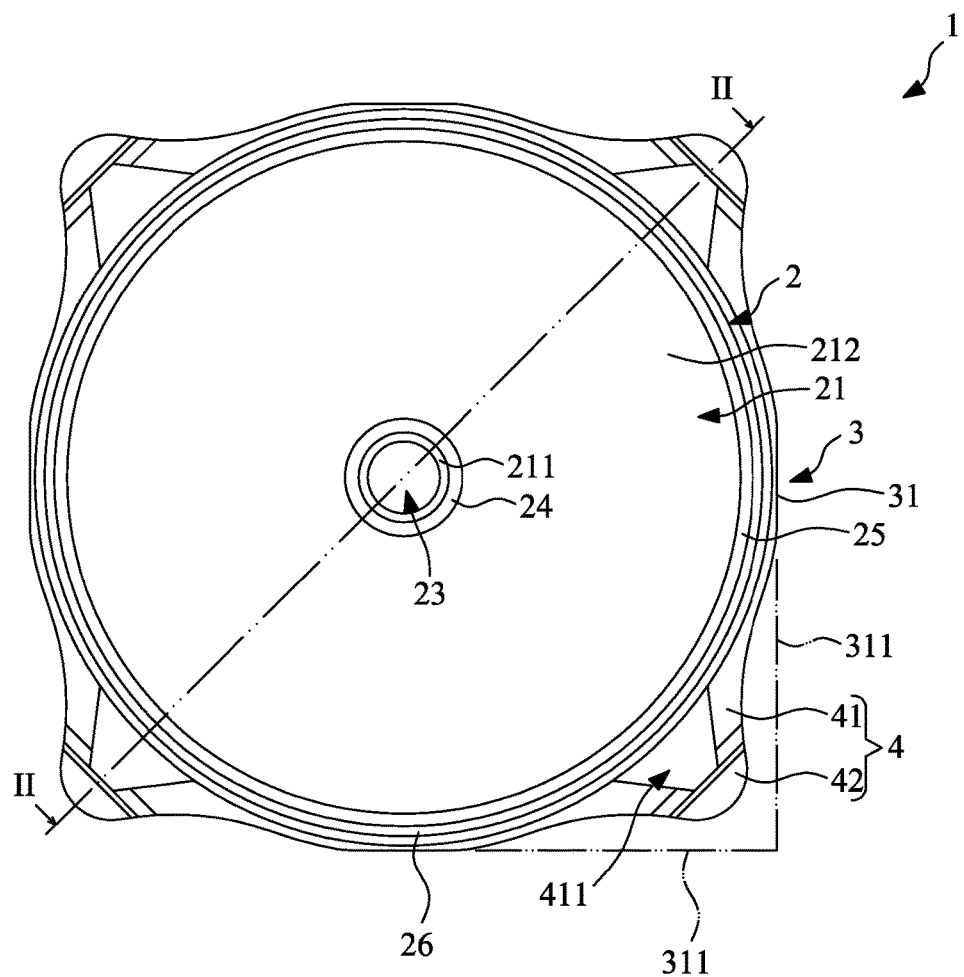
FIG. 1 illustrates a top view of a thermal dissipation device according to some embodiments of the present disclosure.
Figure 2:
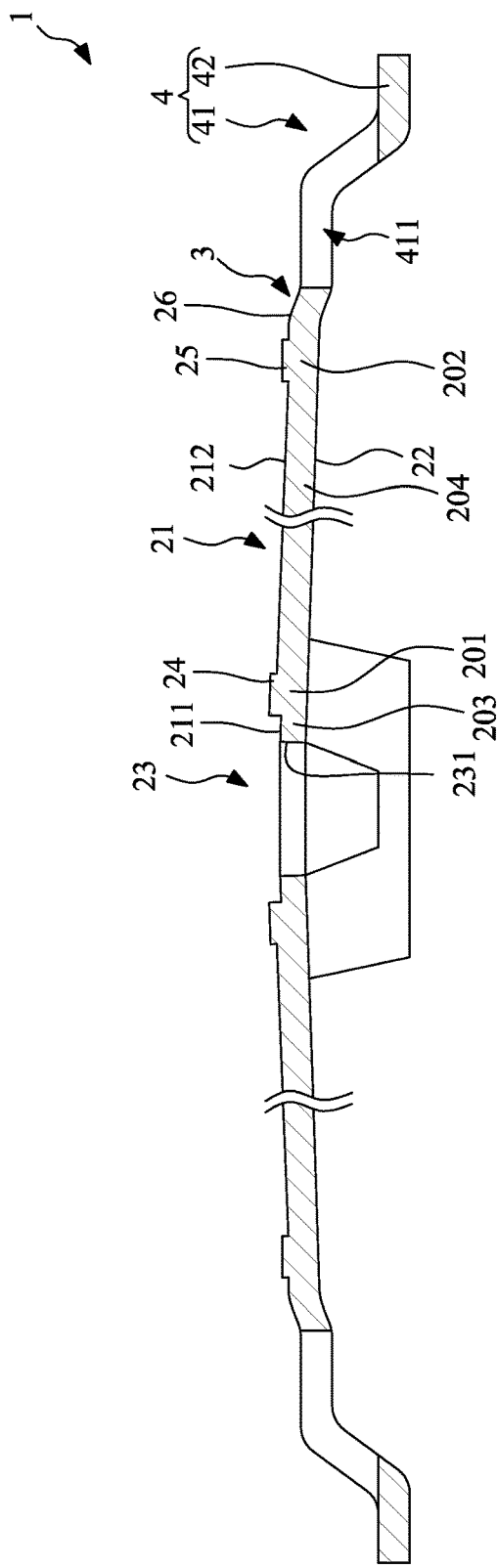
FIG. 2 illustrates a cross-sectional view of a thermal dissipation device taken along line II-II of FIG. 1 according to some embodiments of the present disclosure.

FIG. 1 illustrates a top view of a thermal dissipation device 1 according to some embodiments of the present disclosure. FIG. 2 illustrates a cross-sectional view of the thermal dissipation device 1 taken along line II-II of FIG. 1. The thermal dissipation device 1 includes a main body 2 and one or more support members 4. FIG. 1 shows the thermal dissipation device 1 including four support members 4; however, the present disclosure is not limited thereto.

The main body 2 includes a circumferential lateral wall or a lateral surface 3, a first portion 201, a second portion 202, a third portion 203, a fourth portion 204, an upper surface 21, a lower surface 22, an injection hole 23, an inner ring 24, an outer ring 25 and a periphery 26. The injection hole 23 extends through the main body 2. The inner ring 24 and the outer ring 25 protrude upward from the upper surface 21. The first portion 201 is arranged adjacent to the injection hole 23. The first portion 201 and a lateral surface 231 of the injection hole 23 is spaced by the third portion 203, thus forming a first distance therebetween. The second portion 202 is spaced away from the injection hole 23 and adjacent to the periphery 26 and the lateral surface 3. For example, the second portion 202 is closer to the lateral surface 3 of the main body 2 than to the injection hole 23. The fourth portion 204 is located between the first portion 201 and the second portion 202. The inner ring 24 is located at the first portion 201, which means that the inner ring 24 is adjacent to the injection hole 23 and located between the third portion 203 and the fourth portion 204. The outer ring 25 is located at the second portion 202. For example, the outer ring 25 is spaced away from the injection hole 23 and is adjacent to the periphery 26 and the lateral surface 3, and the outer ring 25 is located between the fourth portion 204 and the periphery 26.

The lateral surface 3 extends outward and downward from the periphery 26 of the main body 2 to the support member 4. The support member 4 connects the lateral surface 3 of the main body 2. Each support member 4 includes a connecting portion 41 and a bottom portion 42. The connecting portion 41 extends outward from the lateral surface 3 and connects the lateral surface 3 and the bottom portion 42. In addition, each support member 4 defines at least one through hole 411.

The lateral surface 3 includes a plurality of flat portions 31 perpendicular to a radius of the lateral surface 3 (e.g., extending perpendicular to a radius of the lateral surface 3). Each support member 4 is located between two adjacent flat portions 31. For example, each support member 4 is located within a corner defined by two imaginary planes 311 crossing over each other, said two imaginary planes 311 respectively extending from two adjacent flat portions 31.

Figure 3:
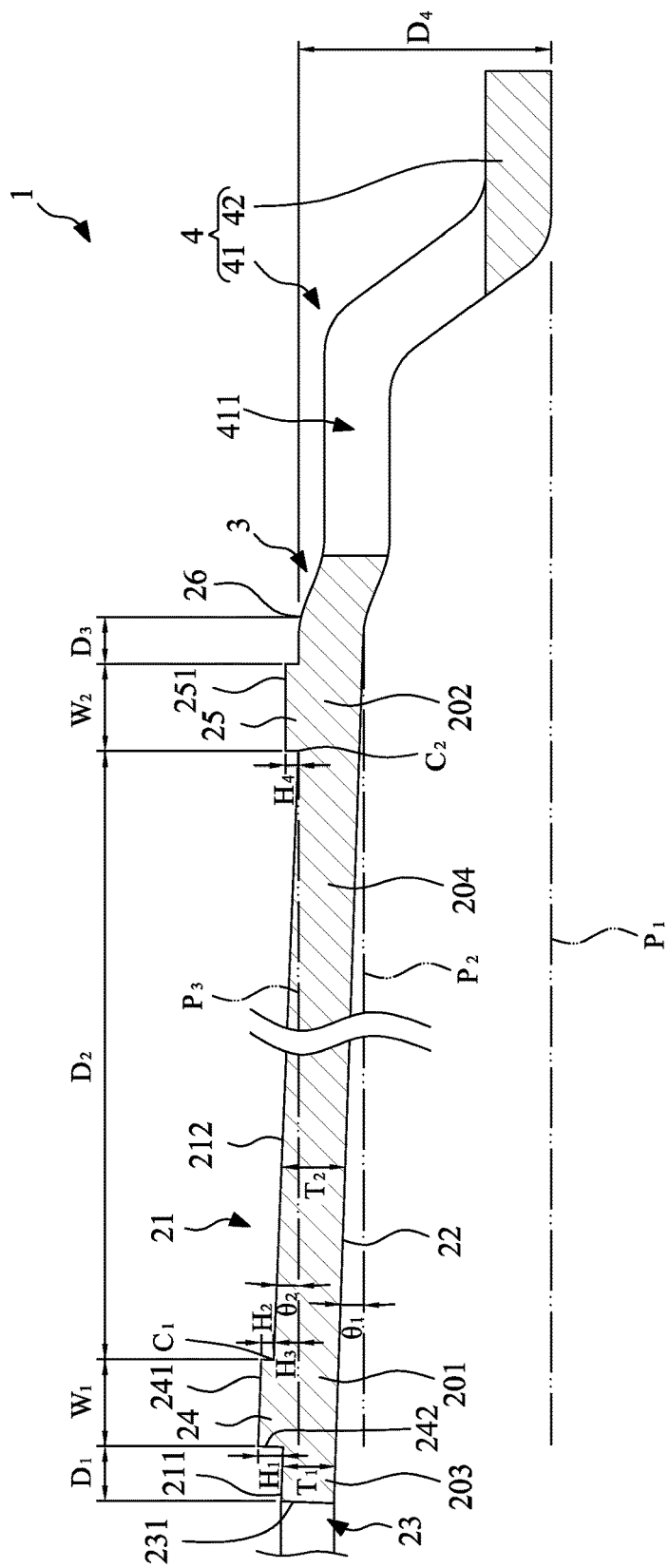
FIG. 3 illustrates an enlarged view of a portion of the thermal dissipation device of FIG. 2 according to some embodiments of the present disclosure.

FIG. 3 illustrates an enlarged view of a portion (e.g., right-hand half) of the thermal dissipation device 1 of FIG. 2. The upper surface 21 includes a first upper surface 211 (corresponding to the third portion 203) and a second upper surface 212 (corresponding to the fourth portion 204). The first upper surface 211 extends between the inner ring 24 and the lateral surface 231 of the injection hole 23. The second upper surface 212 extends between the inner ring 24 and the outer ring 25. The inner ring 24 and the outer ring 25 protrude upward from the second upper surface 212, and an upper surface 241 of the inner ring 24 is higher than an upper surface 251 of the outer ring 25. A distance $H_1$ between the upper surface 241 of the inner ring 24 and the first upper surface 211 is not equal to a distance $H_2$ between the upper surface 241 of the inner ring 24 and the second upper surface 212. For example, in some embodiments, the first upper surface 211 and the second upper surface 212 are not coplanar. However, in some embodiments, a lower surface of the third portion 203 and a lower surface of the fourth portion 204 are coplanar (e.g., the lower surface 22).

In some embodiments, the distance $H_1$ between the upper surface 241 of the inner ring 24 and the first upper surface 211 is greater than the distance $H_2$ between the upper surface 241 of the inner ring 24 and the second upper surface 212. For instance, the distance $H_1$ between the upper surface 241 of the inner ring 24 and the first upper surface 211 may be, but not be limited to, in a range from about 25 micrometers (μm) to about 35 μm. The distance $H_2$ between the upper surface 241 of the inner ring 24 and the second upper surface 212 may be, but not be limited to, in a range from about 10 μm to about 20 μm.

In some embodiments, a diameter of the injection hole 23 is, but not limited to, about 2 millimeters (mm). The first distance $D_1$ between the inner ring 24 and the lateral surface 231 of the injection hole 23 may be, but not be limited to, in a range from about 200 μm to about 450 μm. For example, an inner surface 242 of the inner ring 24 and the lateral surface 231 of the injection hole 23 are not coplanar. A width $W_1$ of the inner ring 24 may be, but not be limited to, about 400 μm. A distance $D_2$ between the inner ring 24 and the outer ring 25 may be, but not be limited to, in a range from about 7.5 mm to about 8.5 mm. A width $W_2$ of the outer ring 25 may be, but not be limited to, about 400 μm. A distance $D_3$ between the outer ring 25 and the periphery 26 may be, but not be limited to, in a range from about 150 μm to about 250 μm.

A thickness $T_1$ of the third portion 203 may be less than a thickness $T_2$ of the fourth portion 204. For instance, a difference between the thickness $T_1$ and the thickness $T_2$ may be substantially equal to a difference between the distance $H_1$ and the distance $H_2$, and may be about 15 μm. In some embodiments, the thickness $T_1$ of the third portion 203 is, but not limited to, in a range from about 265 μm to about 305 μm. The thickness $T_2$ of the fourth portion 204 may be, but not be limited to, in a range from about 280 μm to about 320 μm.

A fourth distance $D_4$ between the periphery 26 and the bottom portion 42 of the support member 4 may be, but not be limited to, in a range from about 1.17 mm to about 1.21 mm.

As shown in FIG. 3, the bottom portions 42 of the support members 4 are on a first plane $P_1$. A first angle $\theta_1$ is formed between the lower surface 22 of the main body 2 and a second plane $P_2$, where the second plane $P_2$ is an imaginary plane parallel to the first plane $P_1$. In some embodiments, the first angle $\theta_1$ is less than about 5 degrees, less than about 10 degrees, less than about 15 degrees, or in a range from about 5 degrees to about 15 degrees. Similarly, a second angle $\theta_2$ is formed between the second upper surface 212 and a third plane $P_3$, where the third plane $P_3$ is an imaginary plane parallel to the first plane $P_1$. In some embodiments, the second angle $\theta_2$ is less than about 5 degrees, less than about 10 degrees, less than about 15 degrees, or in a range from about 5 degrees to about 15 degrees. The second angle $\theta_2$ may be substantially equal to the first angle $\theta_1$.

At least a first intersection point or location $C_1$ is formed between the inner ring 24 and the second upper surface 212. At least a second intersection point or location $C_2$ is formed between the outer ring 25 and the second upper surface 212. The first intersection point $C_1$ may be higher than the second intersection point $C_2$. A distance between the first intersection point $C_1$ and the second intersection point $C_2$ is the aforementioned second distance $D_2$. The second intersection point $C_2$ is located on the third plane $P_3$, and a distance $H_3$ is formed between the first intersection point $C_1$ and the third plane $P_3$. In some embodiments, the distance $H_3$ is, but not limited to, in a range from about 60 μm to about 90 μm. In some embodiments, the distance $H_2$ between the upper surface 241 of the inner ring 24 and the second upper surface 212 is not equal to a distance $H_4$ between the upper surface 251 of the outer ring 25 and the second upper surface 212. In some embodiments, the distance $H_2$ between the upper surface 241 of the inner ring 24 and the second upper surface 212 is less than the distance $H_4$ between the upper surface 251 of the outer ring 25 and the second upper surface 212. In some embodiments, the distance $H_4$ is, but not limited to, in a range from about 20 μm to about 40 μm.

As can be seen in the cross-sectional view of FIG. 3, the main body 2 (including the first portion 201, the second portion 202, the third portion 203 and the fourth portion 204) is inclined from a horizontal plane (e.g., the first plane $P_1$ and the second plane $P_2$). Hence, when viewing the main body 2 as a whole (as shown in FIG. 2 and FIG. 3), the main body 2 presents a shape of a cone. For example, a topmost point of the upper surface 21 or the lower surface 22 of the main body 2 is located at the injection hole 23. The upper surface 21 or the lower surface descend toward the periphery 26, with a bottommost point thereof located at a position corresponding to the periphery 26.

Figure 12:
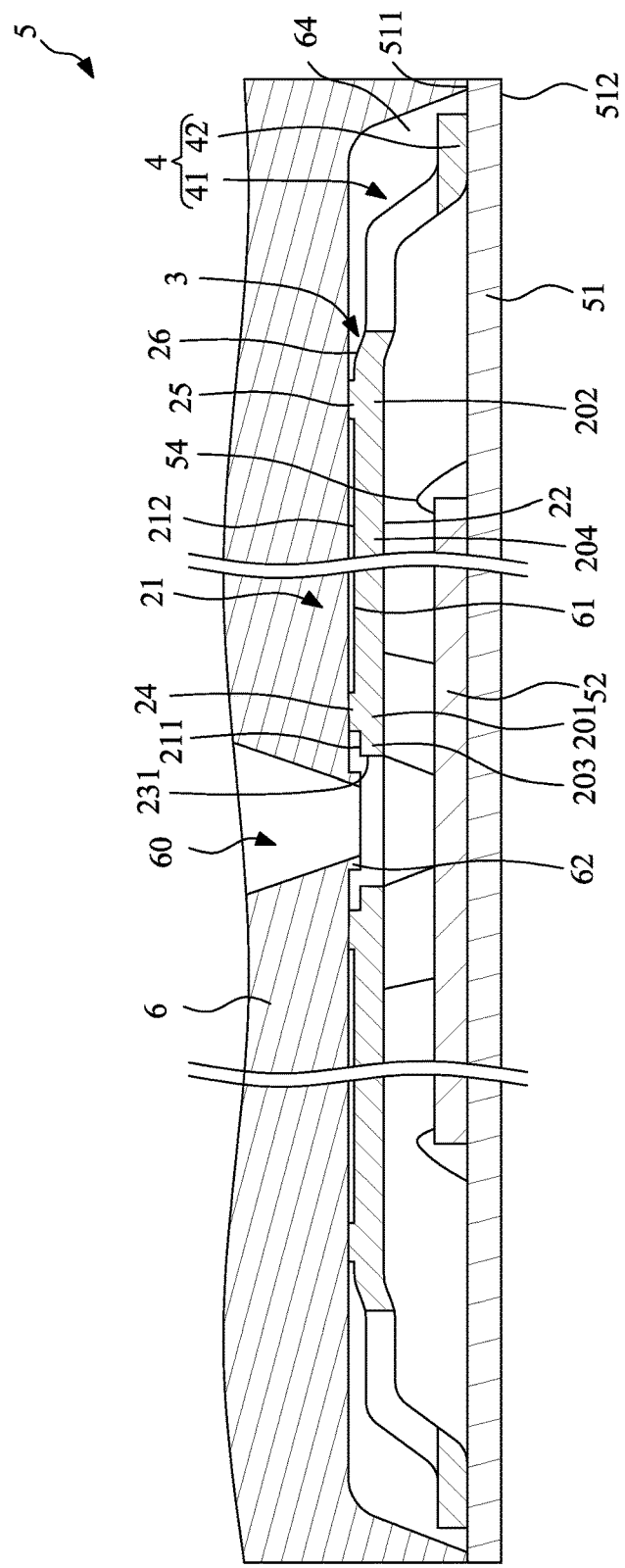
Figure 13:
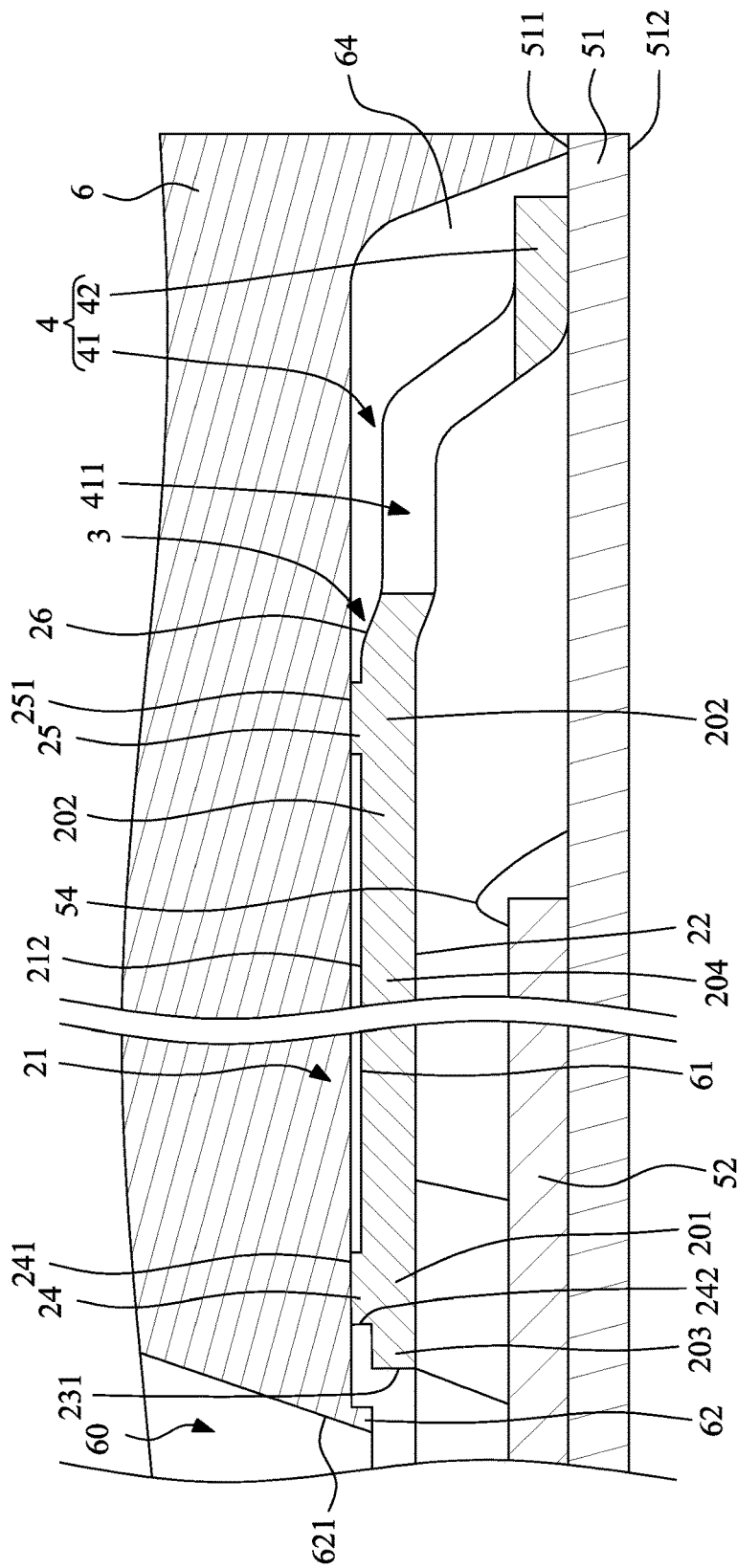
Figure 14:
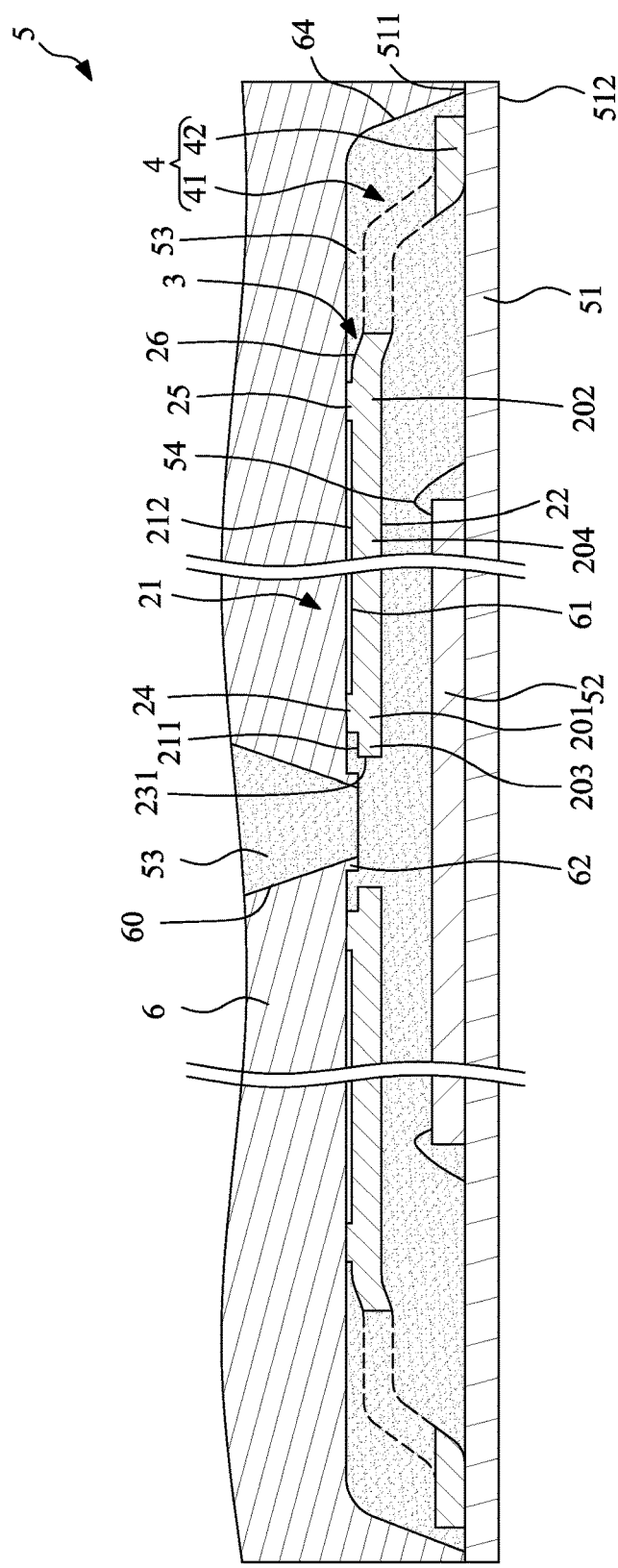

In some embodiments (e.g., as shown in FIG. 1, FIG. 2 and FIG. 3), the arrangement of the inner ring 24 and the outer ring 25 makes both sustain against an inner surface 61 of an injection mold 6 (e.g., as shown in FIG. 12 and FIG. 13) before the molding compound injection process. Such arrangement can prevent a sealant 53 (e.g., as shown in FIG. 14) from flowing to the second upper surface 212, and increase contact area between the injection mold 6 and the thermal dissipation device 1. Accordingly, a stress during mold opening can be released uniformly, thus preventing delamination. In addition, when the injection mold 6 clamps the thermal dissipation device 1, the second upper surface 212 is in a plane form (e.g., the first angle $\theta_1$ and the second angle $\theta_2$ are about 0 degree) and does not protrude upward to form a curved surface. Accordingly, in the case that another thermal dissipation element (such as a thermal dissipation fin) is mounted on the second upper surface 212 after a molding compound injection process, the other thermal dissipation element can be properly mounted thereon without disengaged therefrom. In addition, the design of the distance $H_1$ between the upper surface 241 of the inner ring 24 and the first upper surface 211 can sufficiently solve the problem of delamination near the inner ring 24. For example, if the distance $H_1$ is not large enough (for instance, less than about 25 μm or about 20 μm), instant bounce that occurs during mold opening may cause delamination easily. For example, a space defined by the inner surface 242 of the inner ring 24 and the first upper surface 211 may be large enough for receiving a sufficient amount of the sealant 53 (e.g., as shown in FIG. 14). Hence, the sealant 53 is able to resist instant bounce that occurs during mold opening, thus avoiding delamination.

Figure 4:
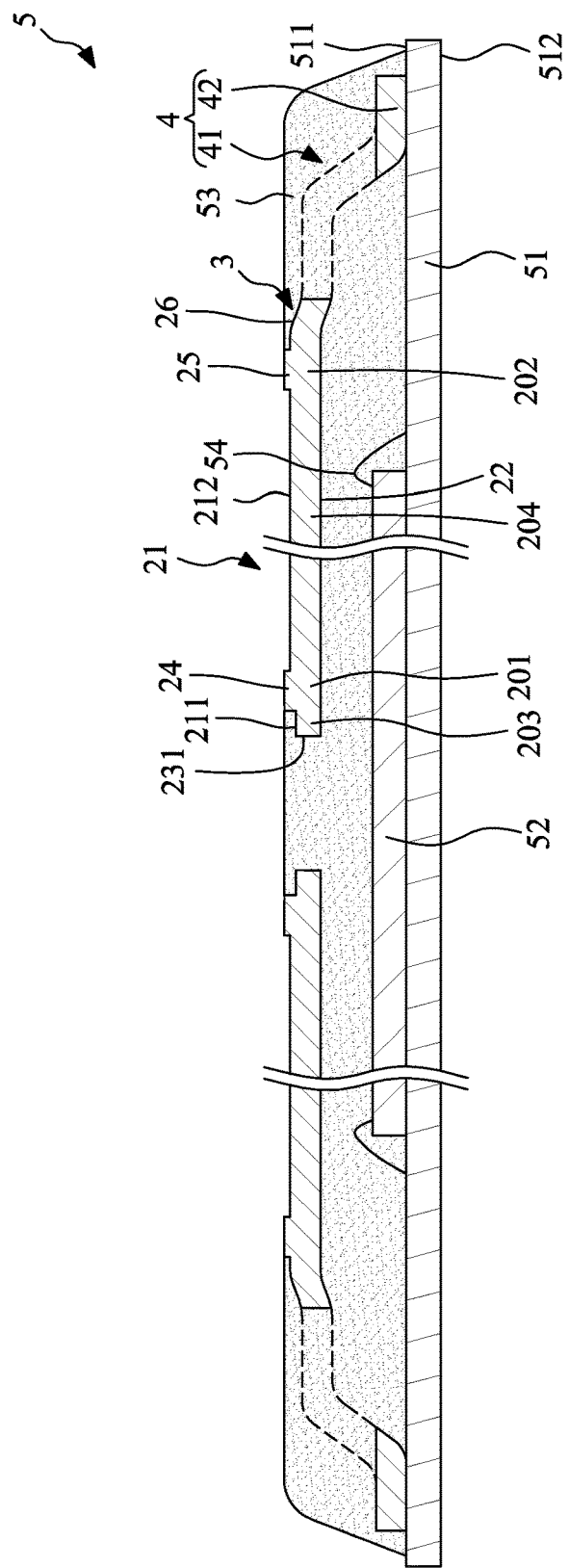
FIG. 4 illustrates a cross-sectional view of a semiconductor package device according to some embodiments of the present disclosure.
Figure 5:
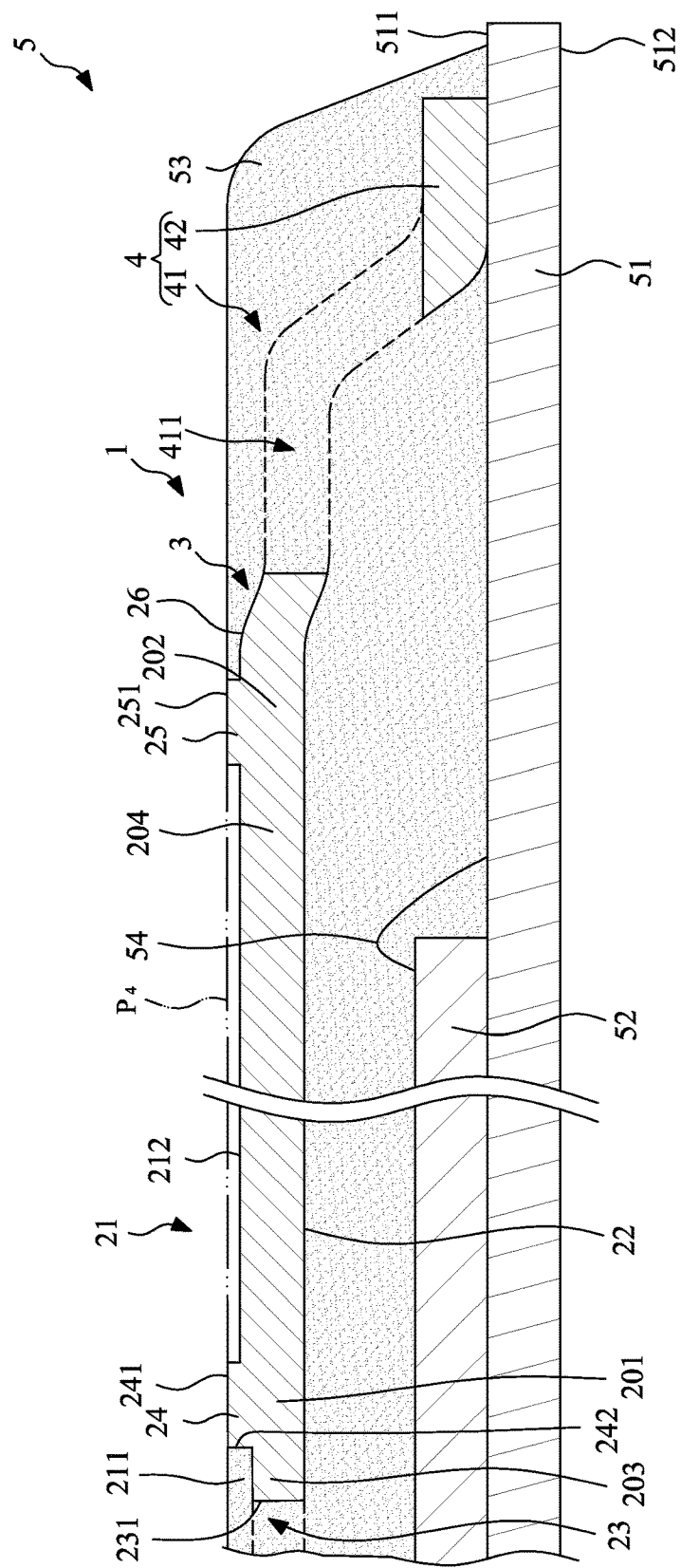
FIG. 5 illustrates an enlarged view of a portion of the semiconductor package device of FIG. 4 according to some embodiments of the present disclosure.

FIG. 4 illustrates a cross-sectional view of a semiconductor package device 5 according to some embodiments of the present disclosure. FIG. 5 illustrates an enlarged view of a portion (e.g., right-hand half) of the semiconductor package device 5 of FIG. 4. The semiconductor package device 5 includes a substrate 51, an electronic component (e.g., semiconductor chip 52), the thermal dissipation device 1 and a sealant 53. The substrate 51 has a first surface 511 and a second surface 512 opposite the first surface 511. The semiconductor chip 52 is mounted on and electrically connected to the first surface 511 of the substrate 51. In some embodiments, the semiconductor chip 52 is adhered to the first surface 511 of the substrate 51 and is electrically connected to the first surface 511 of the substrate 51 through a plurality of conductive wires 54 (e.g., gold wires).

The thermal dissipation device 1 is located above the semiconductor chip 52 and covers the semiconductor chip 52. The structure of the thermal dissipation device 1 is the same as the aforementioned thermal dissipation device 1 shown in FIG. 1 to FIG. 3. An accommodating space defined by the main body 2, the lateral surface 3 and the support member 4 of the thermal dissipation device 1, and the first surface 511 of the substrate 51 is adapted for accommodating the semiconductor chip 52 and the conductive wires 54.

Since both the inner ring 24 and the outer ring 25 can sustain against the inner surface 61 of the injection mold 6 (e.g., as shown in FIG. 12 and FIG. 13) before the molding compound injection process, the upper surface 241 of the inner ring 24 and the upper surface 251 of the outer ring 25 are coplanar after molding compound injection, as shown in FIG. 4 and FIG. 5. For example, the upper surface 241 of the inner ring 24 and the upper surface 251 of the outer ring 25 are substantially at the same horizontal level (e.g., both are located on a fourth plane $P_4$, for example, as shown in FIG. 5. The fourth plane $P_4$ is an imaginary plane substantially parallel to the first surface 511 of the substrate 51. Moreover, the lower surface 22 of the main body 2 is substantially parallel to the first surface 511 of the substrate 51, and the second upper surface 212 is also substantially parallel to the first surface 511 of the substrate 51. In some embodiments, the second upper surface 212 is a flat plane parallel to the fourth plane $P_4$, and does not protrude to form a curved surface. Furthermore, the bottom portion 42 of the support member 4 is mounted (e.g., by adhesion) on the first surface 511 of the substrate 51.

In some embodiments, the second upper surface 212 of the main body 2 is slightly protruded upward to form a protrusion, and a horizontal level of a topmost point of the protrusion is not higher than a horizontal level of the upper surface 241 of the inner ring 24 or the upper surface 251 of the outer ring 25. For example, the topmost point of the protrusion shape does not protrude beyond the fourth plane $P_4$.

The sealant 53 (e.g., molding compound) is located on the first surface 511 of the substrate 51 and covers the semiconductor chip 52, the conductive wires 54 and a portion of the thermal dissipation device 1. A portion of the sealant 53 is located in the through hole 411 of the support member 4. Another portion of the sealant 53 is located inside the injection hole 23, covers the first upper surface 211, and further contacts the inner surface 242 of the inner ring 24. For example, the other portion of the sealant 53 is located in a space defined by the inner surface 242 of the inner ring 24 and the first upper surface 211. Accordingly, the sealant 53 covers the lateral surface 3, the lower surface 22 and the periphery 26 of the main body 2, and the support members 4.

It is noted that, in some embodiments, the sealant 53 does not extend to the second upper surface 212. For example, there is no sealant 53 disposed between the inner ring 24 and the outer ring 25. Accordingly, the entire second upper surface 212 is exposed, thus providing a favorable appearance. However, in some embodiments, a part of resin contained in the sealant 53 may overflow to the second upper surface 212, while fillers contained in the sealant 53 may not overflow to the second upper surface 212.

Figure 6:
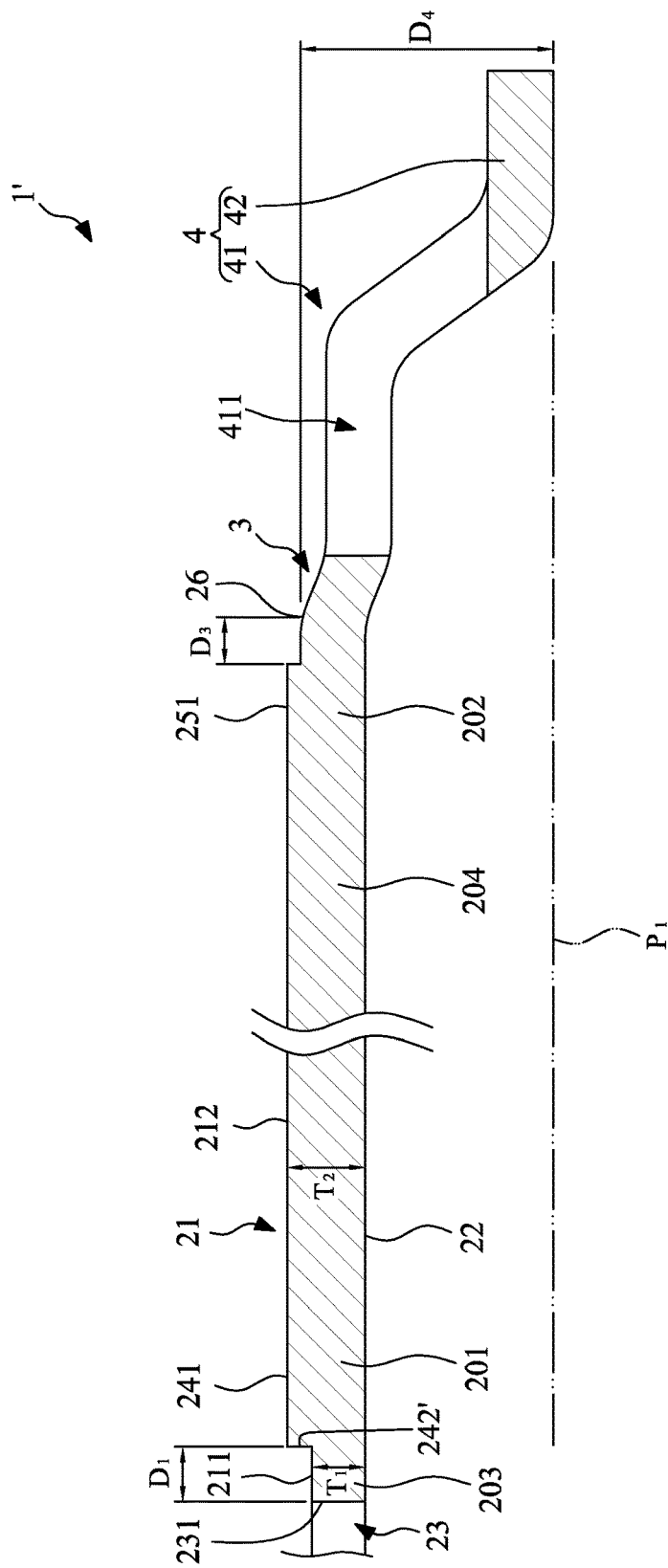
FIG. 6 illustrates a partial, cross-sectional view of a thermal dissipation device according to some embodiments of the present disclosure.

FIG. 6 illustrates a partial, cross-sectional view of a thermal dissipation device 1' according to some embodiments of the present disclosure. Similar to the above, the thermal dissipation device 1' comprises a main body 2 and one or more support members 4. The main body 2 includes a circumferential lateral wall or lateral surface 3, a first portion 201, a second portion 202, a third portion 203, a fourth portion 204, an upper surface 21, a lower surface 22, an injection hole 23 and a periphery 26. The sizes and arrangements of these components are similar to those of the thermal dissipation device 1 of FIG. 1 to FIG. 3, and thus may not be repeated again.

The upper surface 21 of the main body 2 includes a first upper surface 211 and a second upper surface 212. The first upper surface 211 corresponds to the third portion 203, and the second upper surface 212 corresponds to the first portion 201, the fourth portion 204 and the second portion 202. The main body 2 further includes an inner surface 242' extending between the first upper surface 211 and the second upper surface 212. The injection hole 23 includes a lateral surface 231 extending between the first upper surface 211 and the lower surface 22 of the main body 2. In some embodiments, the first portion 201 and the second portion 202 are at the same horizontal level.

Figure 7:
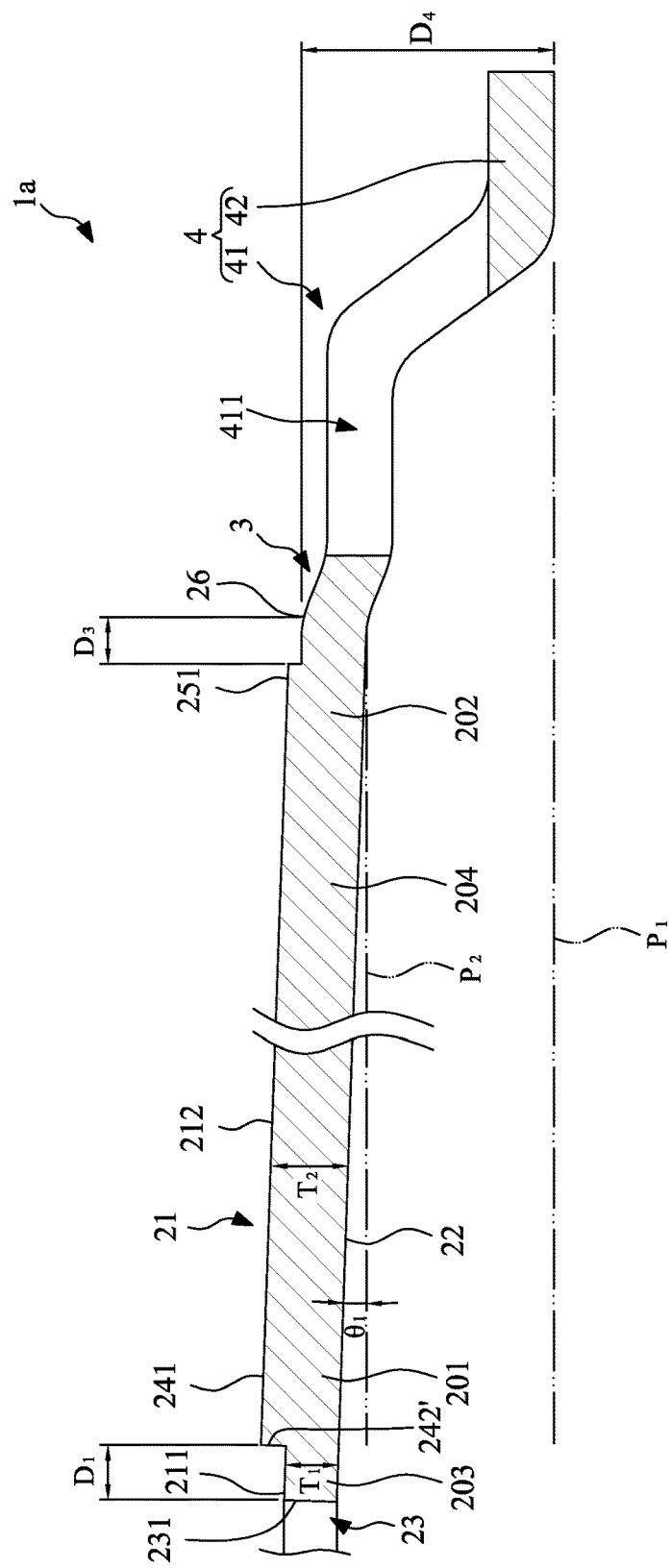
FIG. 7 illustrates a partial, cross-sectional view of a thermal dissipation device according to some embodiments of the present disclosure.

FIG. 7 illustrates a partial, cross-sectional view of a thermal dissipation device 1a according to some embodiments of the present disclosure. The thermal dissipation device 1a includes the components similar to the thermal dissipation device 1' of FIG. 6. However, in some embodiments, the thermal dissipation device 1a has the first portion 201 that is higher than the second portion 202. In some embodiments, an upper surface 241 of the first portion 201 is higher than an upper surface 251 of the second portion 202.

Figure 8:
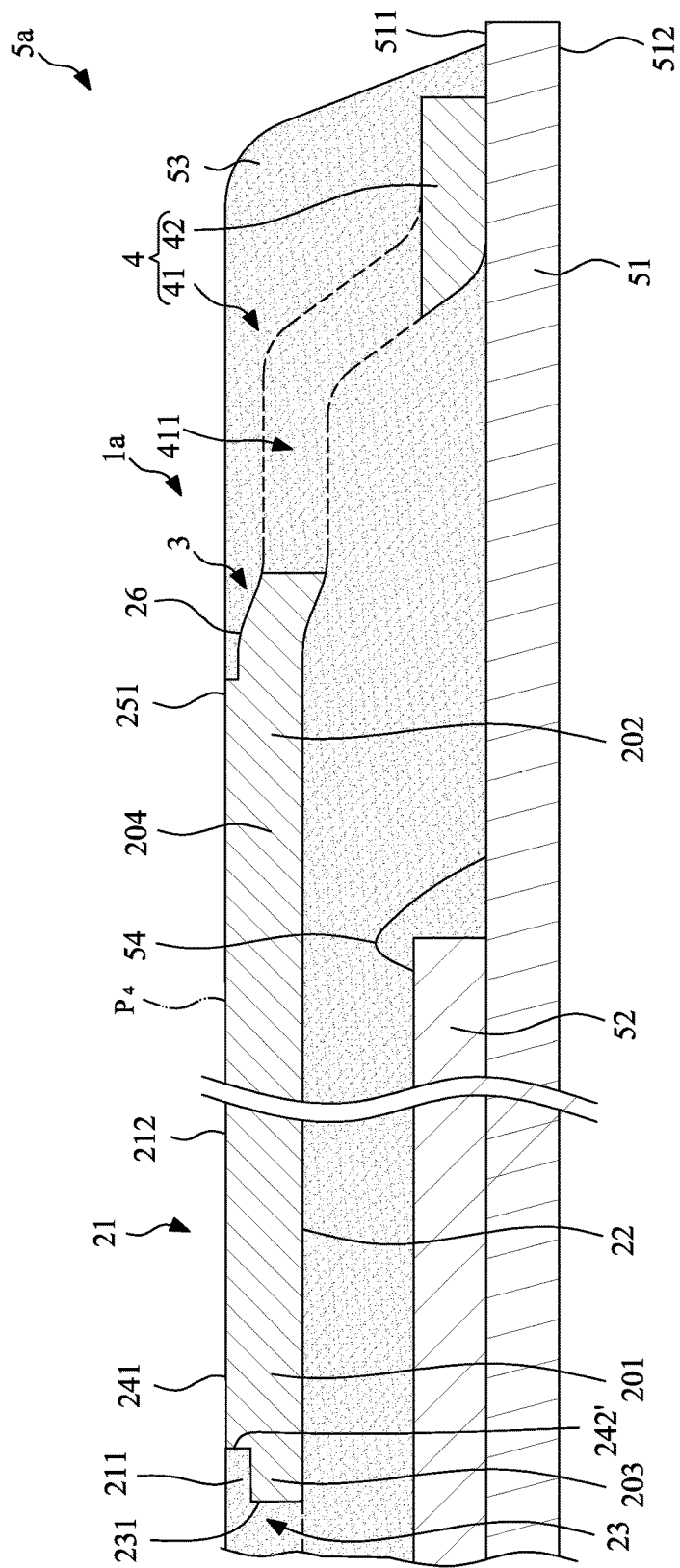
FIG. 8 illustrate a partial, cross sectional view of a semiconductor package device according to some embodiments of the present disclosure.

FIG. 8 illustrates a partial, cross-sectional view of a semiconductor package device 5a according to some embodiments of the present disclosure. The sizes and arrangements of the components in the semiconductor package device 5a are similar to those of the semiconductor package device 5 (e.g., as shown in FIG. 5) describe above. However, the thermal dissipation device 1 is replaced by the thermal dissipation device 1a.

Figure 9:
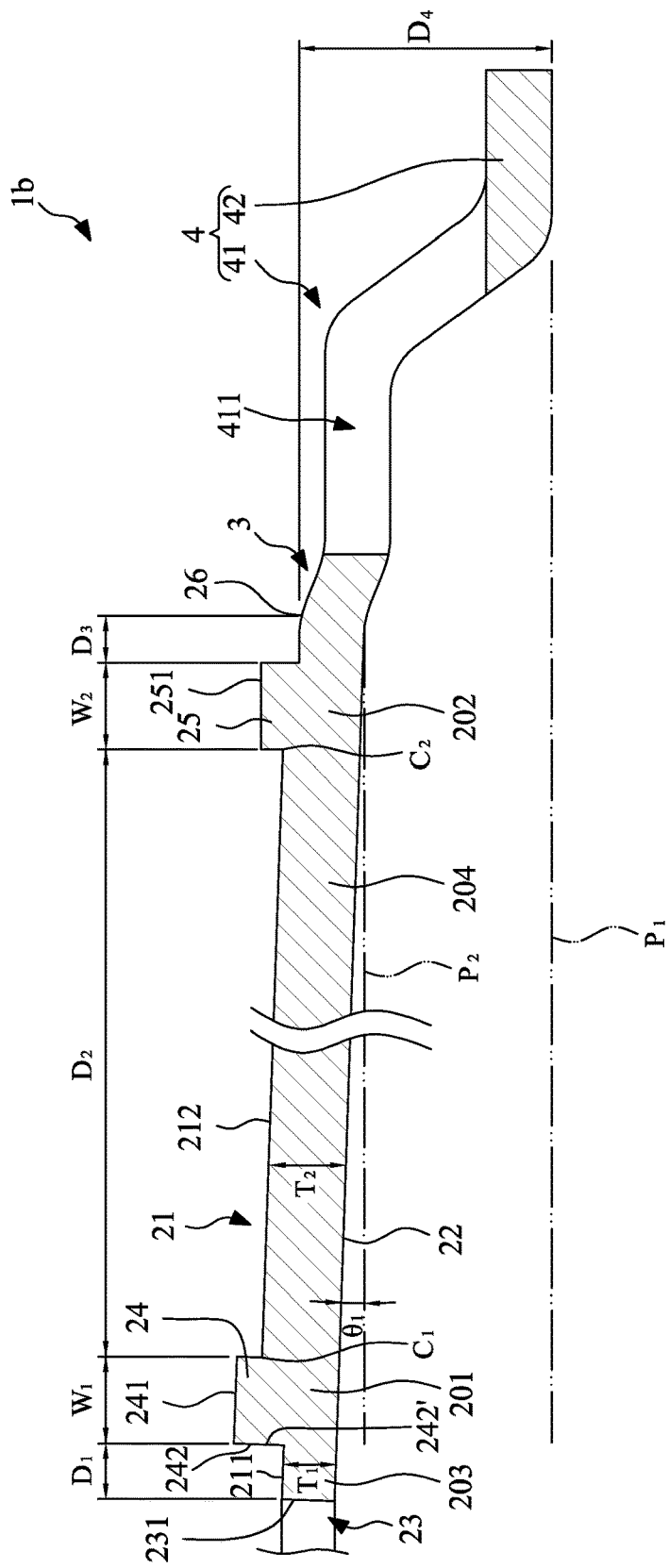
FIG. 9 illustrates a partial, cross-sectional view of a thermal dissipation device according to some embodiments of the present disclosure.

FIG. 9 illustrates a partial, cross-sectional view of a thermal dissipation device 1b according to some embodiments of the present disclosure. The structure of the thermal dissipation device 1b is similar to that of the thermal dissipation device 1a of FIG. 7, except that the first portion 201 further includes an inner ring 24 and the second portion 202 further includes an outer ring 25. The inner ring 24 and the outer ring 25 protrude from the second upper surface 212, with the arrangement thereof similar to that of the thermal dissipation device 1 of FIG. 1 to FIG. 3. The inner ring 24 of the thermal dissipation device 1b has an inner surface 242. The inner surface 242' of the main body 2 and the inner surface 242 of the inner ring 24 are substantially coplanar.

Figure 10:
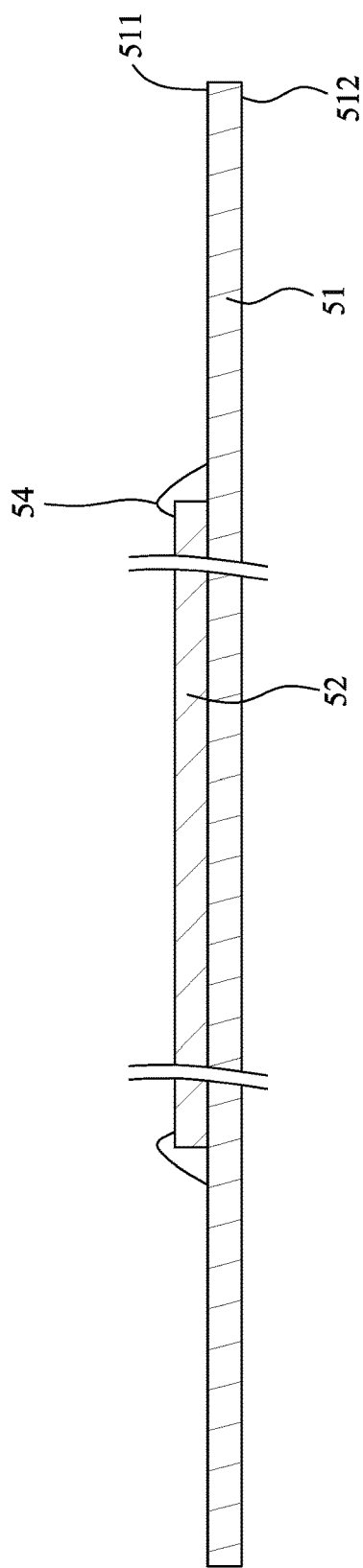
FIG. 10, FIG. 11, FIG. 12, FIG. 13 and FIG. 14 illustrate a method for manufacturing a semiconductor package device including a thermal dissipation device according to some embodiments of the present disclosure.

FIG. 10 to FIG. 14 illustrate a method for manufacturing a semiconductor package device including a thermal dissipation device according to some embodiments of the present disclosure. With reference to FIG. 10, a substrate 51 is provided. The substrate 51 has a first surface 511 and a second surface 512. Next, a semiconductor chip 52 is mounted on the first surface 511 of the substrate 51. The semiconductor chip 52 is then electrically connected to the substrate 51. In the some embodiments, the semiconductor chip 52 is adhered to the first surface 511 of the substrate 51, and is electrically connected to the first surface 511 of the substrate 51 through a plurality of conductive wires 54 (e.g., gold wires).

Figure 11:
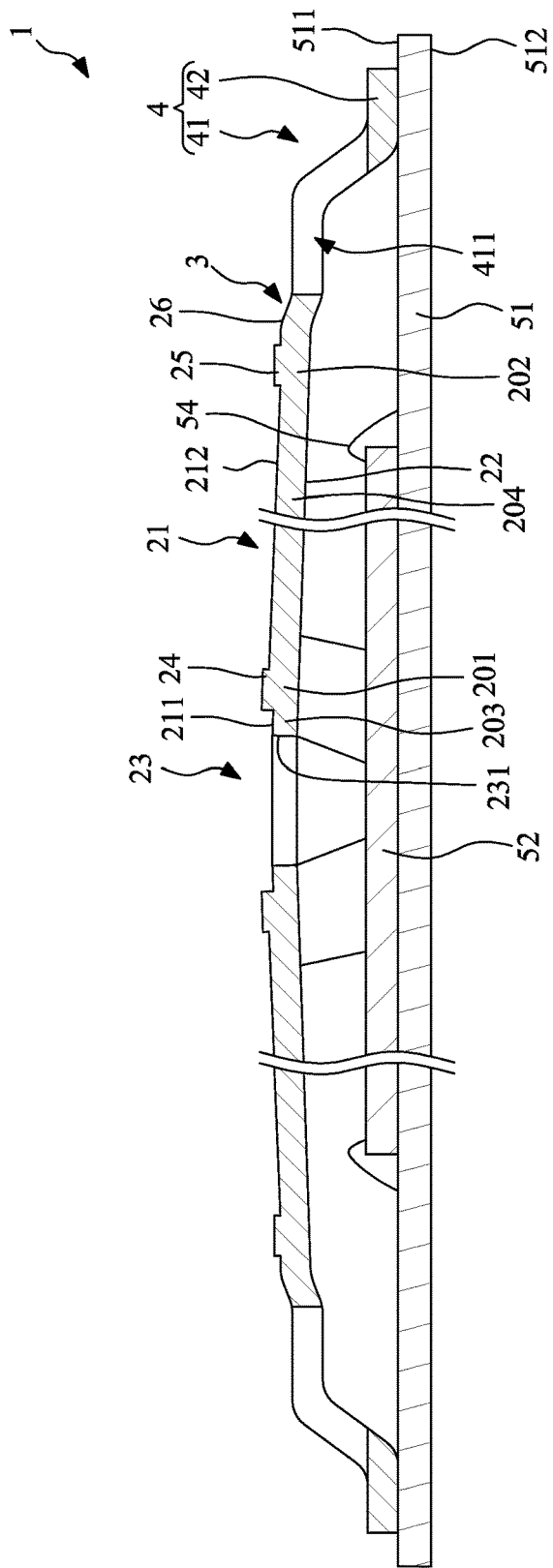

With reference to FIG. 11, a thermal dissipation device 1 is provided above the semiconductor chip 52 and covers the semiconductor chip 52. The thermal dissipation device 1 is the same as the thermal dissipation device 1 shown in FIG. 1 to FIG. 3. The main body 2 with the lateral surface 3 and the support member 4 of the thermal dissipation device 1, and the first surface 511 of the substrate 51 jointly define an accommodating space for accommodating the semiconductor chip 52 and the conductive wires 54. In some embodiments, the bottom portions 42 of the support members 4 are mounted (e.g., by adhesion) on the first surface 511 of the substrate 51.

With reference to FIG. 12 and FIG. 13, where FIG. 13 is an enlarged view of a portion of FIG. 12, an injection mold 6 is provided. The injection mold 6 includes an inner surface 61, a runner 60, an injection gate 62 and a cavity 64. The cavity 64 is defined by the inner surface 61 of the injection mold 6. The runner 60 is defined by the injection gate 62 and communicates with the cavity 64.

Then, the injection mold 6 is moved toward the substrate 51, so as to accommodate the thermal dissipation device 1 in the cavity 64. In some embodiments, the upper surface 241 of the inner ring 24 and the upper surface 251 of the outer ring 25 sustain against an upper surface of the cavity 64 (e.g., the inner surface 61 of the injection mold 6), and the injection gate 62 is aligned with the injection hole 23 of the main body 2.

In some embodiments, the upper surface of the cavity 64 is a flat surface and is substantially parallel to the first surface 511 of the substrate 51. The upper surface of the cavity 64 firstly sustains against the upper surface 241 of the inner ring 24, and then further sustains against the upper surface 251 of the outer ring 25, thus making the upper surface 241 of the inner ring 24 and the upper surface 251 of the outer ring 25 at the same horizontal level.

Since both the inner ring 24 and the outer ring 25 can sustain against the inner surface 61 of the injection mold 6, the upper surface 241 of the inner ring 24 and the upper surface 251 of the outer ring 25 are coplanar (e.g., substantially at the same horizontal level). Accordingly, in the molding compound injection process thereafter, the sealant 53 can be prevented from flowing on the second upper surface 212 (e.g., as shown in FIG. 14). Contact area between the injection mold 6 and the thermal dissipation device 1 can also be increased. Thus, a stress during mold opening can be released uniformly, which can avoid delamination.

In some embodiments, the lower surface 22 of the main body 2 is substantially parallel to the first surface 511 of the substrate 51, and the second upper surface 212 is also substantially parallel to the first surface 511 of the substrate 51. In some embodiments, the second upper surface 212 is a flat plane and does not protrude to form a curved surface. Accordingly, in the case that another thermal dissipation element (such as a thermal dissipation fin) is mounted on the second upper surface 212 after molding compound injection, the other thermal dissipation element can be properly mounted thereon without being disengaged therefrom.

However, in some embodiments, the second upper surface 212 of the main body slightly protrudes to form a protrusion. A horizontal level of a topmost point of the protrusion is not higher than that of the upper surface 241 of the inner ring 24 or the upper surface 251 of the outer ring 25.

As shown in FIG. 13, the injection gate 62 extends in the injection hole 23 of the main body 2. The injection gate 62 has a lateral wall 621 which does not contact the inner surface 242 of the inner ring 24. In some embodiments, a distance between the lateral wall 621 of the injection gate 62 and the inner surface 242 of the inner ring 24 is greater than the first distance $D_1$ between the inner ring 24 and the lateral surface 231 of the injection hole 23. This arrangement not only avoids damage of the injection gate 62 due to collision with the thermal dissipation device 1, but also allows a portion of the sealant 53 (e.g., as shown in FIG. 14) to flow into a space defined by the inner surface 242 of the inner ring 24, the first upper surface 211, the lateral wall 621 of the injection gate 62 and the inner surface 61 of the injection mold 6.

With reference to FIG. 14, a sealant 53 is injected into the cavity 64 through the runner 60 of the injection gate 62, such that the sealant 53 is located on the first surface 511 of the substrate 51 and covers the semiconductor chip 52, the conductive wires 54 and a part of the thermal dissipation device 1. Accordingly, the semiconductor package device 5 shown in FIG. 4 and FIG. 5 is obtained. It can be understood that since the injection gate 62 extends in the injection hole 23 of the main body 2, it is a "center gate" injection manner from a top of an injection mold. As a result, impact to the plurality of conductive wires 54 on the semiconductor chip 52 during molding compound injection can be sufficiently reduced. Short circuit or open circuit due to tilt of conductive wires 54 can be prevented, thus increasing production yield of the semiconductor package device 5.

In some embodiments, the sealant 53 is injected into the thermal dissipation device 1 and flows through the through hole 411 of the support member 4 to cover the lateral surface 3 and the upper surface 21 of the main body 2 as well as the support member 4, with the second upper surface 212 of the main body 2 remaining exposed.

In some embodiments, a portion of the sealant 53 flows into the space defined by the inner surface 242 of the inner ring 24, the first upper surface 211, the lateral wall 621 of the injection gate 62 and the inner surface 61 of the injection mold 6. According to some embodiments, the inner ring 24 and the outer ring 25 block the sealant 53 from flowing on the second upper surface 212, and thus the second upper surface 212 remains exposed to provide a favorable appearance. However, in some embodiments, a portion of resin contained in the sealant 53 may overflow to the second upper surface 212, while fillers contained in the sealant 53 do not overflow to the second upper surface 212.

Next, after the sealant 53 is solidified, the injection mold 6 is moved upward and away from the substrate 51 for releasing the semiconductor package device 5 therefrom (for example, the molding opening process), thus the semiconductor package device 5 shown in FIG. 4 and FIG. 5 is obtained.

In some embodiments, since both the inner ring 24 and the outer ring 25 sustain against the inner surface 61 of the injection mold 6, contact area between the injection mold 6 and the thermal dissipation device 1 can be increased. Accordingly, a stress during mold opening can be released uniformly, thus preventing delamination. In some embodiments, since the sealant 53 has the portion located in the space defined by the inner surface 242 of the inner ring 24, the first upper surface 211, the lateral wall 621 of the injection gate 62 and the inner surface 61 of the injection mold 6, instant bounce that occurs during mold opening can be resisted, thus avoiding delamination. For example, the arrangement of the distance $H_1$ between the upper surface 241 of the inner ring 24 and the first upper surface 211 sufficiently solves the problem of delamination near the inner ring 24. If the distance $H_1$ is not large enough (for instance, less than about 25 μm or about 20 μm), instant bounce that occurs during mold opening may cause delamination easily. For example, a space defined by the inner surface 242 of the inner ring 24 and the first upper surface 211 may be large enough for receiving a sufficient amount of the sealant 53 (e.g., as shown in FIG. 14). Hence, the sealant 53 is able to resist instant bounce that occurs during mold opening, thus avoiding delamination.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A thermal dissipation device, comprising:
   a main body having an upper surface, a lower surface opposite to the upper surface, and a lateral surface, the main body defining an injection hole extending through the main body, and the main body including an inner ring protruding from the upper surface and adjacent to the injection hole and an outer ring protruding from the upper surface and adjacent to the lateral surface; and
   a support member connecting the lateral surface of the main body,
   wherein an upper surface of the inner ring is higher than an upper surface of the outer ring, and a first intersection point between the inner ring and the upper surface of the main body is higher than a second intersection point between the outer ring and the upper surface of the main body.

2. The thermal dissipation device of claim 1, wherein the upper surface of the main body includes a first upper surface between the inner ring and a lateral surface of the injection hole, and a second upper surface between the inner ring and the outer ring, the first intersection point is located between the inner ring and the second upper surface, and the second intersection point is located between the outer ring and the second upper surface.

3. The thermal dissipation device of claim 2, wherein a distance between the upper surface of the inner ring and the first upper surface is different from a distance between the upper surface of the inner ring and the second upper surface.

4. The thermal dissipation device of claim 3, wherein the distance between the upper surface of the inner ring and the first upper surface is greater than the distance between the upper surface of the inner ring and the second upper surface.

5. The thermal dissipation device of claim 3, wherein the distance between the upper surface of the inner ring and the first upper surface is in a range from about 25 micrometers (μm) to about 35 μm.

6. The thermal dissipation device of claim 3, wherein the distance between the upper surface of the inner ring and the second upper surface is in a range from about 10 μm to about 20 μm.

7. The thermal dissipation device of claim 2, wherein a distance between the lateral surface of the injection hole and an inner surface of the inner ring is in a range from about 200 μm to about 450 μm.

8. A thermal dissipation device, comprising:
   a main body having an upper surface, a lower surface opposite to the upper surface, an inner surface, and a lateral surface, the main body defining an injection hole extending through the main body and adjacent to the inner surface; and
   a support member connecting the lateral surface of the main body,
   wherein the upper surface of the main body includes a first upper surface and a second upper surface, the injection hole has a lateral surface, the inner surface of the main body extends between the second upper surface and the first upper surface, and the lateral surface of the injection hole extends between the first upper surface and the lower surface of the main body.

9. The thermal dissipation device of claim 8, wherein the second upper surface has a first portion adjacent to the injection hole and a second portion closer to the lateral surface of the main body than to the injection hole, and the first portion is higher than the second portion.

10. The thermal dissipation device of claim 9, wherein the first portion includes an inner ring protruding from the second upper surface, and the second portion includes an outer ring protruding from the second upper surface.

11. The thermal dissipation device of claim 10, wherein an upper surface of the inner ring is higher than an upper surface of the outer ring, and a first intersection point between the inner ring and the second upper surface is higher than a second intersection point between the outer ring and the second upper surface.

12. The thermal dissipation device of claim 10, wherein a distance between an upper surface of the inner ring and the first upper surface is different from a distance between the upper surface of the inner ring and the second upper surface.

13. The thermal dissipation device of claim 12, wherein the distance between the upper surface of the inner ring and the first upper surface is greater than the distance between the upper surface of the inner ring and the second upper surface.

14. The thermal dissipation device of claim 12, wherein the distance between the upper surface of the inner ring and the first upper surface is in a range from about 25 μm to about 35 μm.

15. The thermal dissipation device of claim 12, wherein the distance between the upper surface of the inner ring and the second upper surface is in a range from about 10 μm to about 20 μm.

16. The thermal dissipation device of claim 10, wherein a distance between the lateral surface of the injection hole and an inner surface of the inner ring is in a range from about 200 μm to about 450 μm.

17. The thermal dissipation device of claim 14, wherein the inner surface of the inner ring and the inner surface of the main body are substantially coplanar.

18. A semiconductor package device, comprising:
   a substrate;
   an electronic component disposed on the substrate;
   a thermal dissipation device disposed on the substrate and covering the electronic component, wherein the thermal dissipation device includes:
      a main body having an upper surface, a lower surface opposite to the upper surface, an inner surface, and a lateral surface, the main body defining an injection hole extending through the main body and adjacent to the inner surface; and
      a support member defining at least one through hole, wherein the support member connects the lateral surface of the main body and is disposed on the substrate; and
   a sealant encapsulating the substrate, the electronic component and the thermal dissipation device,
   wherein the upper surface of the main body includes a first upper surface and a second upper surface, the injection hole has a lateral surface, the inner surface of the main body extends between the second upper surface and the first upper surface, the lateral surface of the injection hole extends between the first upper surface and the lower surface of the main body, and the sealant covers a space defined by the first upper surface and the inner surface of the main body.

19. The semiconductor package device of claim 18, wherein the main body includes an inner ring protruding from the second upper surface and adjacent to the injection hole, and an outer ring protruding from the second upper surface and adjacent to the lateral surface of the main body.

20. The semiconductor package device of claim 19, wherein an upper surface of the outer ring and an upper surface of the inner ring are substantially coplanar.

21. The semiconductor package device of claim 19, wherein a distance between an upper surface of the inner ring and the first upper surface is different from a distance between the upper surface of the inner ring and the second upper surface.

22. The semiconductor package device of claim 21, wherein the distance between the upper surface of the inner ring and the first upper surface is greater than the distance between the upper surface of the inner ring and the second upper surface.

23. The semiconductor package device of claim 21, wherein the distance between the upper surface of the inner ring and the first upper surface is in a range from about 25 μm to about 35 μm.

24. The semiconductor package device of claim 21, wherein the distance between the upper surface of the inner ring and the second upper surface is in a range from about 10 μm to about 20 μm.

25. The semiconductor package device of claim 19, wherein a distance between the lateral surface of the injection hole and an inner surface of the inner ring is in a range from about 200 μm to about 450 μm.

26. The semiconductor package device of claim 25, wherein the inner surface of the inner ring and the inner surface of the main body are substantially coplanar.

* * * * *